(12) United States Patent
Poulton et al.

(10) Patent No.: US 8,310,294 B2
(45) Date of Patent: Nov. 13, 2012

(54) LOW-POWER CLOCK GENERATION AND DISTRIBUTION CIRCUITRY

(75) Inventors: John W. Poulton, Chapel Hill, NC (US); Robert E. Palmer, Carrboro, NC (US); Andrew M. Fuller, Durham, NC (US)

(73) Assignee: Rambus Inc., Sunnyvale, CA (US)

( * ) Notice: Subject to any disclaimer, the term of this patent is extended or adjusted under 35 U.S.C. 154(b) by 8 days.

(21) Appl. No.: 12/525,181

(22) PCT Filed: Feb. 12, 2008

(86) PCT No.: PCT/US2008/001869
§ 371 (c)(1), (2), (4) Date: Oct. 22, 2009

(87) PCT Pub. No.: WO2008/100523
PCT Pub. Date: Aug. 21, 2008

(65) Prior Publication Data
US 2010/0085100 A1  Apr. 8, 2010

Related U.S. Application Data

(60) Provisional application No. 60/900,804, filed on Feb. 12, 2007.

(51) Int. Cl.
*H03K 3/00* (2006.01)
(52) U.S. Cl. .................. 327/295; 327/155; 327/299
(58) Field of Classification Search .......... 327/154–159, 327/295–296, 298–299
See application file for complete search history.

(56) References Cited

U.S. PATENT DOCUMENTS

| 5,295,164 | A | * | 3/1994 | Yamamura ................... 375/376 |
| 5,621,360 | A | * | 4/1997 | Huang ............................ 331/57 |
| 5,655,113 | A | | 8/1997 | Leung et al. |
| 5,850,157 | A | | 12/1998 | Zhu et al. |
| 6,034,537 | A | | 3/2000 | Burrows et al. |
| 6,140,854 | A | * | 10/2000 | Coddington et al. ......... 327/158 |
| 6,590,423 | B1 | | 7/2003 | Wong |
| 6,593,769 | B1 | | 7/2003 | Rai |

(Continued)

FOREIGN PATENT DOCUMENTS
WO  WO 03/090355 A2  10/2003

OTHER PUBLICATIONS

PCT/US2008/001869 The International Search Report and Written Opinion mailed Sep. 23, 2008. 13 pages.

(Continued)

*Primary Examiner* — An Luu
(74) *Attorney, Agent, or Firm* — Silicon Edge Law Group LLP; Arthur J. Behiel

(57) ABSTRACT

A communication IC includes a power-efficient clock-distribution system. A control loop monitors and adjusts the peak and trough voltages of a clock signal. The clock signal can be adaptively adjusted to center the peak and trough voltages about the switching threshold voltage of a clock buffer. The voltage swing of the clock signal can thus be made small and, as a consequence, power efficient. The control loop can monitor and control more than one clock signal.

40 Claims, 6 Drawing Sheets

U.S. PATENT DOCUMENTS

| | | | |
|---|---|---|---|
| 6,657,474 B2 | 12/2003 | Varadarajan | |
| 6,895,190 B1 * | 5/2005 | Neumann et al. | 398/202 |
| 6,897,699 B1 | 5/2005 | Nguyen | |
| 6,995,554 B2 * | 2/2006 | Loke et al. | 324/76.54 |
| 7,054,687 B1 * | 5/2006 | Andersen et al. | 607/19 |
| 7,061,283 B1 | 6/2006 | Ghia et al. | |
| 7,071,757 B2 | 7/2006 | Bonaccio et al. | |
| 7,180,353 B2 | 2/2007 | Chiu et al. | |
| 7,277,357 B1 * | 10/2007 | Ma et al. | 365/233.12 |
| 7,368,961 B2 * | 5/2008 | Werner et al. | 327/156 |
| 2006/0170480 A1 | 8/2006 | Chiu et al. | |

OTHER PUBLICATIONS

Ta, Paul D. et al., "A Low Power Clock Distribution Scheme for Complex IC System." ASIC Conf. & Exhibit, 1991. Proceedings. 4th Annual IEEE International Rochester, NY, USA Sep. 23-27, 1991. pp. P1-5.1 to P1-5.4.

Pangjun, Jatuchai et al., "Low-Power Clock Distribution Using Multiple Voltages and Reduced Swings." IEEE Transactions on VLSI Systems. vol. 10, No. 3, Jun. 2002. pp. 309-318.

* cited by examiner

LOW-POWER CLOCK GENERATION AND DISTRIBUTION CIRCUITRY

FIELD

Embodiments of the invention relate to signal distribution circuitry, and more particularly to low-power clock distribution circuitry.

BACKGROUND

Synchronous digital systems use distributed clock signals as timing references for the movement of data. A clock distribution network, often called a "clock tree," distributes a clock signal from a common point to synchronous elements that capture data on edges of the clock signal. Unfortunately, distributed clock signals typically consume a considerable percentage of the total active power of digital systems.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
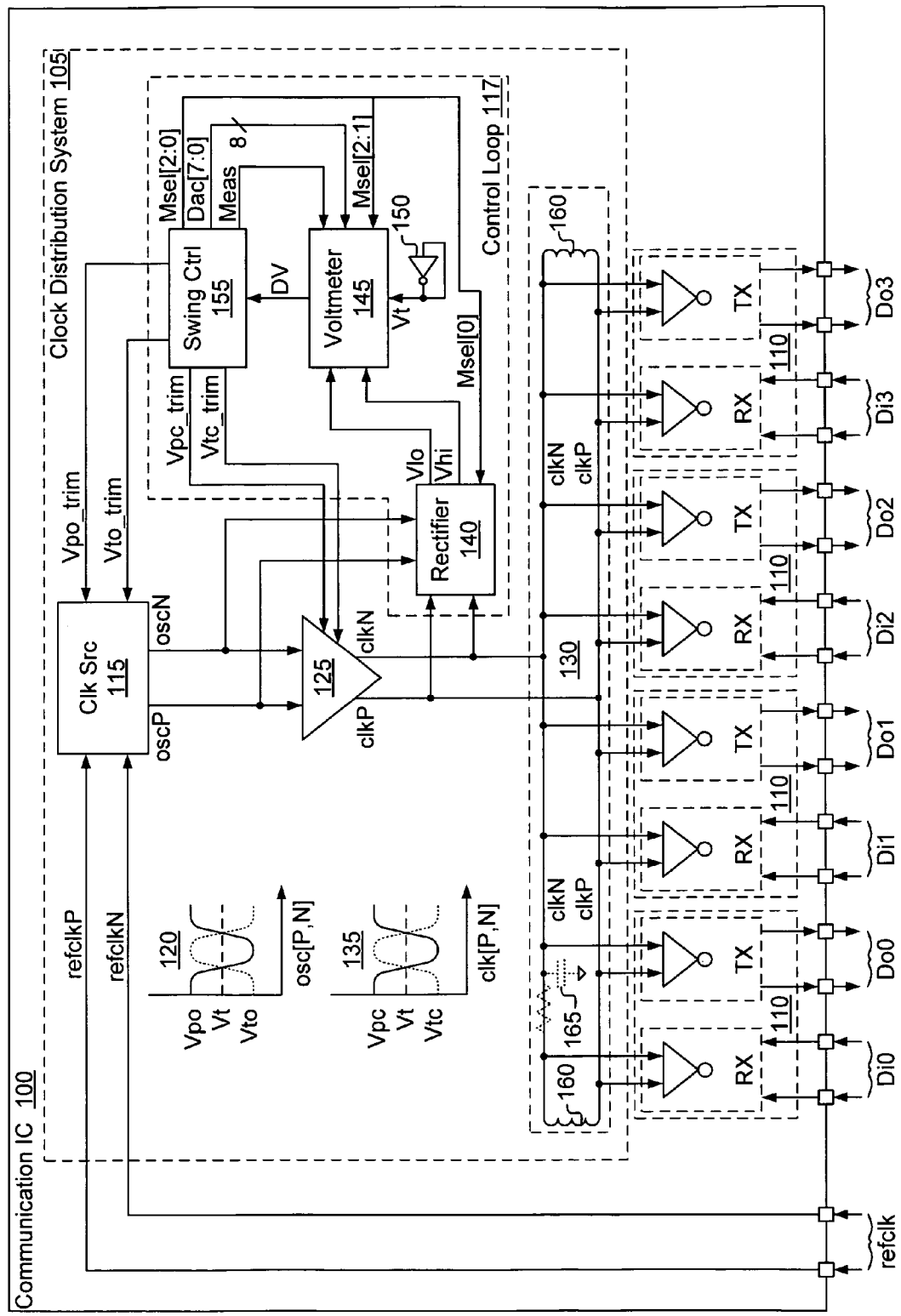
FIG. 1 depicts communication integrated circuit (IC) 100 in which a clock-distribution system 105 distributes a differential clock signal clk[P,N] to a plurality of clock destination circuits (e.g., inverters) within four transceivers 110.

FIG. 1 depicts communication integrated circuit (IC) 100 in which a clock-distribution system 105 distributes a differential clock signal clk[P,N] to a plurality of clock destination circuits (e.g., inverters) within four transceivers 110. A clock source 115 derives an oscillator clock signal osc[P,N] from an external reference-clock signal refclk[P,N]. A control loop 117 monitors the voltage swing of clock signal osc[P,N] and adjusts clock source 115 to control both the peak voltage level Vpo and the trough voltage level Vto of clock signal osc[P,N]. In one embodiment, control loop 117 adaptively adjusts clock signal osc[P,N] such that voltage levels Vpo and Vto remains centered around a switching threshold voltage Vt of a clock buffer while maintaining a fixed swing, as depicted in diagram 120, despite variations in process, supply voltage, and temperature. Optimizing the swing and common mode voltage across these variations allows power consumption to be minimized, making the clock source 115 more power efficient. In one embodiment signals oscP and oscN are 600 mVpp, so clock signal osc[P,N] is 1.2 Vppd (peak-to-peak differential).

Clock-distribution system 105 additionally includes a source clock buffer 125 that conveys clock signal osc[P,N] from source 115 to a resonant clock-distribution network 130 as a buffered, distributed clock signal clk[P,N]. Clock buffer 125 is centrally located on network 130 and drives a 1.2 Vppd clock signal onto the distribution wiring of network 130 and out to the four transceivers 110. Clock signal clk[P,N] is restored to CMOS levels at each transmitter TX and receiver RX with a CMOS inverter. As with clock signal osc[P,N], control loop 117 monitors the voltage swing of clock signal clk[P,N] and adjusts buffer 125 to control both the peak voltage level Vpc and the trough voltage level Vtc. In one embodiment, clock signal clk[P,N] is adaptively adjusted such that voltage levels Vpc and Vtc remain centered around the clock-buffer threshold voltage Vt, as depicted in diagram 135. The voltage swing of clock signal clk[P,N] can thus be optimized for performance while minimizing power consumption in buffer 125 across variations in process, voltage, and temperature. In this example, clock signal clk[P,N] synchronizes four receivers to communicate differential input data Di[3:0] and four transmitters to communication differential output data signals Do[3:0]. In other embodiments differential signals may be single-ended, and a different number of transmitters and receivers may be connected to the clock distribution network.

Control loop 117 includes a rectifier 140, a voltmeter 145, a replica inverter 150 and swing-control circuitry 155 in this example. Rectifier 140 can, at the direction of control circuitry 155, capture the peak and trough voltages of either clock signal osc[P,N] or clock signal clk[P,N] and deliver the resulting high (peak) and low (trough) voltage Vhi and Vlo to voltmeter 145. Inverter 150 replicates the behavior of clock buffers, including the destination inverters within transceivers 110, and has its input and output nodes shorted. Thus connected, inverter 150 provides a stable inverter switching threshold voltage Vt to voltmeter 145.

By application of control signals Msel[2:1], dac[7:0], and Meas, control circuitry 155 directs voltmeter 145 to provide a digital voltage measure DV for any of analog inputs Vhi, Vlo, and Vt. Control circuitry 155 then adjusts the voltage swings of signals osc[P,N] and clk[P,N] based upon measures of those signals. In this embodiment, control circuitry 155 controls the peak and trough voltages Vpo and Vto of clock signal osc[P,N] by applying appropriate trim signals Vpo_trim and Vto_trim, respectively; and similarly controls the peak and trough voltages Vpc and Vtc of clock signal clk[P,N] by applying appropriate trim signals Vpc_trim and Vtc_trim, respectively. Assuming the inverter switching threshold voltage Vt is 400 mV and the desired peak-to-peak voltages for clock signals osc[P,N] and clk[P,N] are each 600 mV, for example, control circuitry 155 would set control signals Vpo_trim and Vpc_trim such that the peak voltages Vpo and Vpc of clock signals were 700 mV and would set control signals Vto_trim and Vtc_trim such that the trough voltages Vto and Vtc were 100 mV.

Inductors 160 are connected across the differential lines of clock distribution network 130 to form a tank circuit with the distribution capacitance 165. Trim capacitors may be added where network 130 has a fairly high Q in order to fine-tune the resonance frequency, but none are used in this example. Inductors 160 may be e.g. flat differential spiral coils on the top two levels of metal.

In one embodiment, network 130 resonates at 3.125 GHz with a Q of 3.5, giving a 3.5× increase in impedance relative to a similar RC network presented by the wiring and loads alone. Resonating the clock load has the significant side benefit of reducing duty-factor distortion in the distributed clock and more generally rejecting phase modulation due to noise sources in the clock multiplier and buffer. In this embodiment, the clock distribution wires of network 130 are routed in metal-8 of a 9-metal standard CMOS process, 1.6 mm in each direction from source buffer 125. The total tank capacitance of network 130 is about 0.5 pF, mostly due to the wiring itself. The wires have an incremental inductance of 0.32 nH/mm. Each end of the distribution wiring is, in this embodiment, loaded with an 8.6 nH/mm differential square spiral inductor of six turns and 140 um on a side. A single-frequency embodiment of network 130 may be implemented without a tuning mechanism. Network 130 may, however, be tunable to accommodate a range of resonant frequencies in other embodiments. A transmission-line-based clock network may be preferable for wider ranges of frequency.

Figure 2:
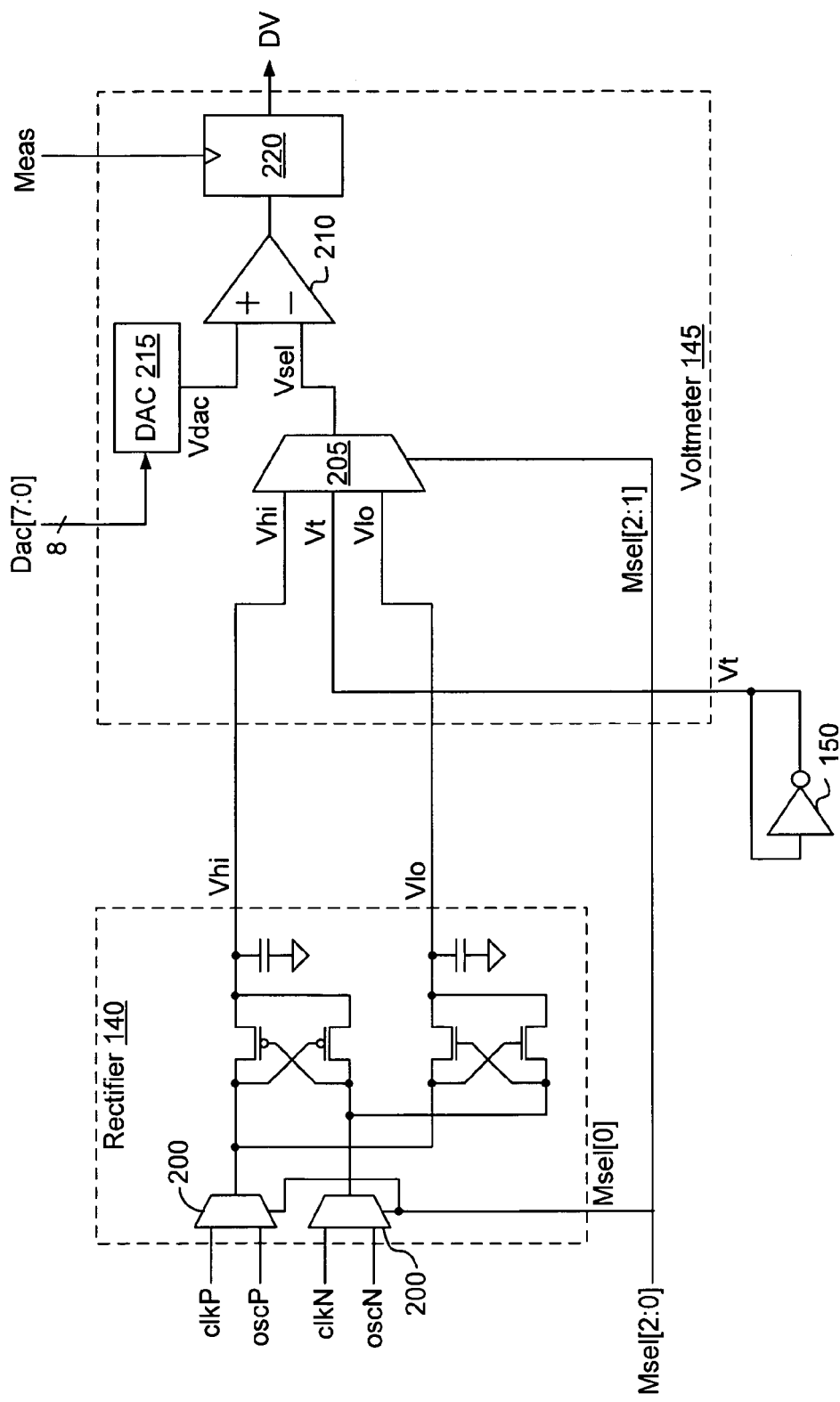
FIG. 2 depicts rectifier 140, voltmeter 145, and inverter 150 in accordance with one embodiment.

FIG. 2 depicts rectifier 140, voltmeter 145, and inverter 150 in accordance with one embodiment. Rectifier 140 includes multiplexers 200, e.g. implemented using CMOS pass gates, that alternatively select as inputs clock signal osc[P,N] or clock signal clk[P,N] at the direction of signal Msel[0] from control circuitry 155 (FIG. 1). The cross-coupled pMOS transistors rectify the selected clock signal to accumulate the peak voltage Vhi on a capacitor, whereas the cross-coupled nMOS similarly accumulate the trough voltage Vlo.

Voltmeter 145 includes a multiplexer 205, a differential amplifier 210, a digital-to-analog converter (DAC) 215, and a synchronous storage element 220. Multiplexer 205 presents one of voltages Vhi, Vt, or Vlo as voltage Vsel to amplifier 210 responsive to select signals Msel[2:1]. Amplifier 210 outputs a voltage representative of a logic one (zero) if voltage Vdac is greater than (less than) voltage Vsel. Storage element 220 captures the logic level from amplifier 210 as signal DV when signal Meas is asserted. The output of DAC 215 is controlled, in this example, by an eight-bit control signal Dac[7:0], which control voltage Vdac from e.g. about zero to 1.0 volts in steps of about 4 mV. Signal DV from voltmeter 145 is thus a digital value that indicates whether selected voltage Vsel is greater than or less than voltage Vdac. As discussed in more detail below, voltmeter 145 measures a selected voltage Vsel in conjunction with control circuitry that scans over the range of DAC settings to find which voltage Vdac best approximates voltage Vsel. In other embodiment the voltmeter can independently provide voltage measurements with greater than one bit of resolution.

Figure 3:
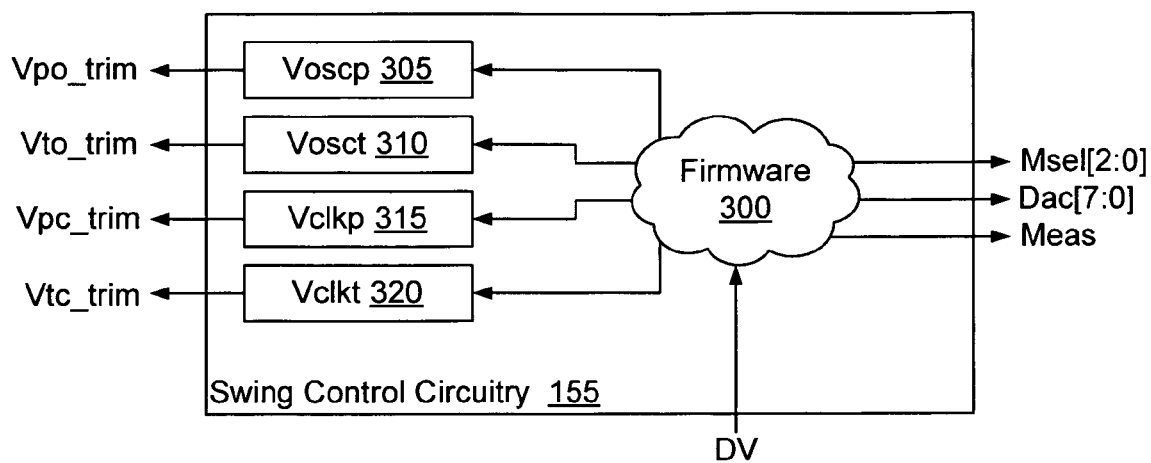
FIG. 3 depicts swing control circuitry 155 of FIG. 1 in accordance with one embodiment.

FIG. 3 depicts swing control circuitry 155 of FIG. 1 in accordance with one embodiment. Swing control circuitry 155 includes some firmware 300 that controls rectifier 140 and voltmeter 145 to measure the swing voltages (peak and trough) for clock signals osc[P,N] and clk[P,N]. Control circuitry 155 then uses these measures to set the values of four trim registers 305, 310, 315, and 320 that collectively control the signal swings of the clock signals. Register 305 stores and conveys trim signal Vpo_trim to control the peak voltage Vpo of clock signal osc[P,N]; register 310 stores and conveys trim signal Vto_trim to control the trough voltage Vto of clock signal osc[P,N]; register 315 stores and conveys trim signal Vpc_trim to control the peak voltage Vpc of clock signal clk[P,N]; and register 320 stores and conveys trim signal Vtc_trim to control the trough voltage Vtc of clock signal clk[P,N].

Swing control circuitry 155 can be instantiated on the same IC as the clock distribution network it controls, and may be dedicated to the purpose of controlling clock-signal swing as detailed herein. Swing control circuitry 155 may also be implemented using a general-purpose processor, which may be adapted to monitor and/or control other aspects of circuit performance.

Figure 4:
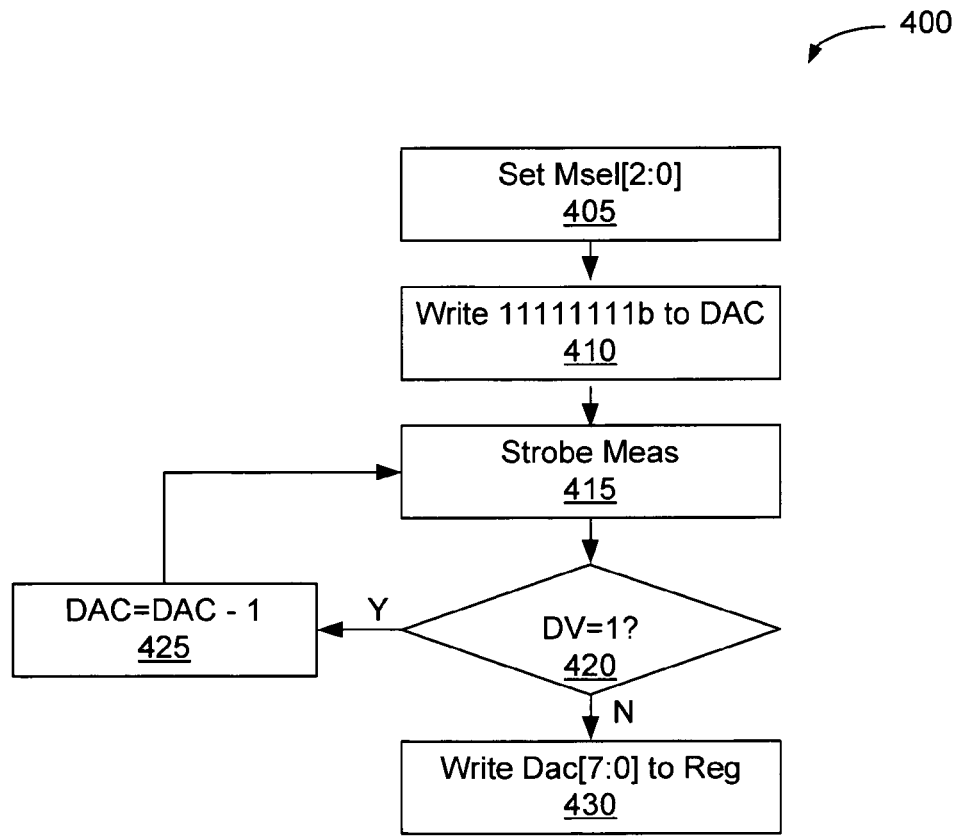
FIG. 4 is a flowchart 400 depicting how swing control circuitry 155 measures a selected voltage using rectifier 140 and voltmeter 145 in one embodiment.

FIG. 4 is a flowchart 400 depicting how swing control circuitry 155 measures a selected voltage using rectifier 140 and voltmeter 145 in one embodiment. First, in step 405, control circuitry 155 issues a three-bit select signal Msel[2:0] based upon the voltage of interest. With reference to FIG. 2, and assuming the peak voltage Vpo of signal osc[P,N] were of interest, signal Msel[2:0] would be set such that multiplexers 200 select signals oscP and oscN and multiplexer 205 selects signal Vhi (Vhi is a measure of the peak voltage of the selected clock signal, whereas Vlo is a measure of the trough voltage). Control circuitry 155 then, in step 410, sets voltage Vdac to its maximum value by setting Dac[7:0] to 256 (11111111b). Signal Meas is then strobed (step 415) to capture the comparison of voltages Vdac and Vsel, where Vsel is the peak measure of clock signal osc[P,N] due to the value of Msel[2:0].

If signal DV, the result of the comparison between voltage Vdac and Vsel, is a voltage representative of a logic one, then voltage Vdac is greater than voltage Vsel. Per decision 420, control circuitry 155 decrements the DAC value Dac[7:0], and thus reduces voltage Vdac, before returning to step 415 to repeat the comparison for the lower DAC voltage Vdac. The process will continue until decision 420 notes that voltage Vdac has dropped below voltage Vsel. The current DAC value Dac[7:0] is then saved as a measure of voltage Vsel, and thus of the voltage of interest (step 430). In one embodiment the DAC measurement is performed using a binary-search, rather than single-step, algorithm. In one embodiment the process of flowchart 400 is repeated eight times and the average of the resulting DAC values is saved as the measured voltage. In other embodiments each voltage comparison captured in step 415 may be performed multiple times for each DAC setting and the results averaged or selected by majority vote.

Figure 5:
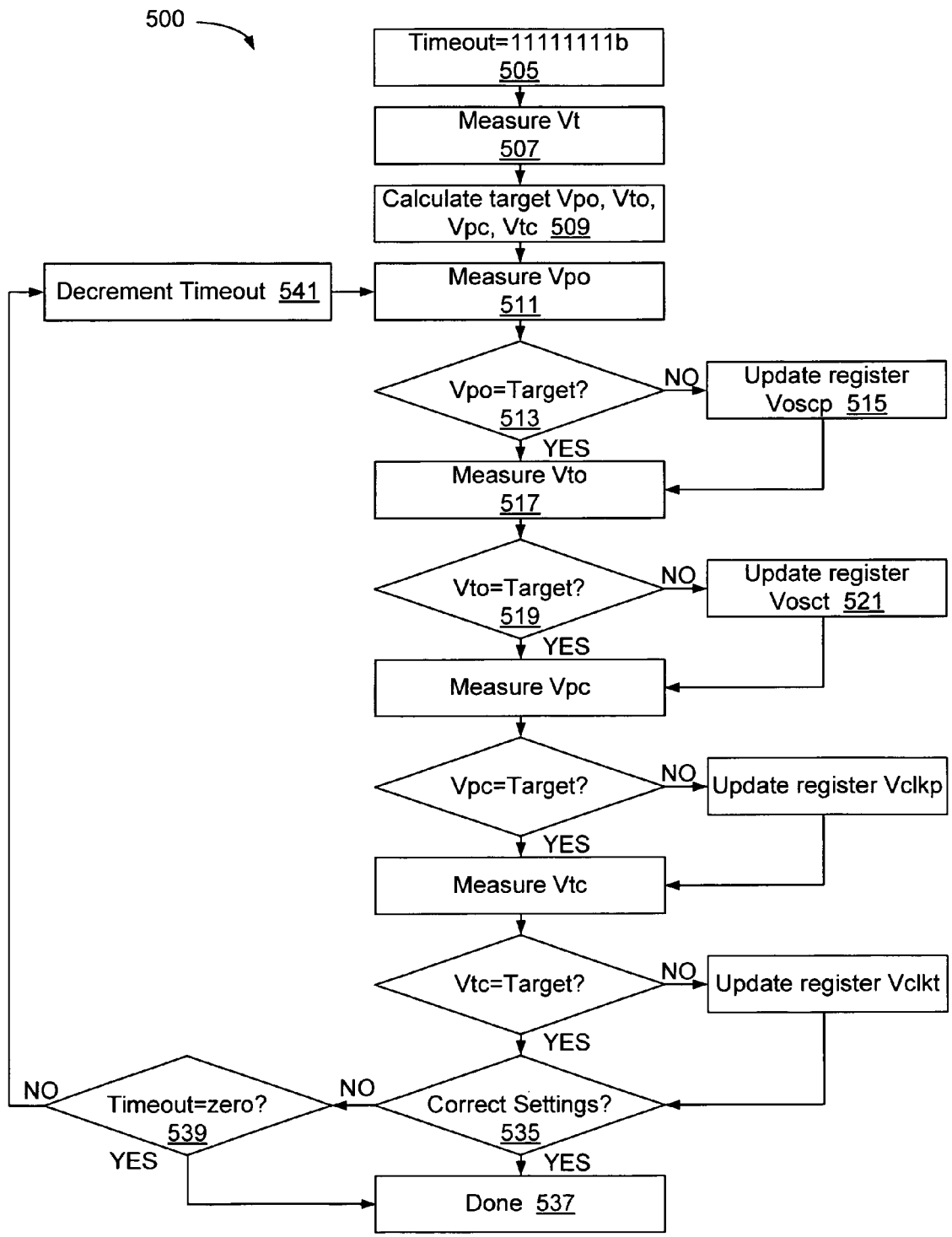
FIG. 5 is a flowchart 500 depicting how swing control circuitry 155 sets the swing voltage levels (peak and trough) for each of clock signals osc[P,N] and clk[P,N] of FIGS. 1 and 2.

FIG. 5 is a flowchart 500 depicting how swing control circuitry 155 sets the swing voltage levels (peak and trough) for each of clock signals osc[P,N] and clk[P,N] of FIGS. 1 and 2. First, an eight-bit timeout register (not shown) is set to its maximum value, 256 in this example (step 505). The timeout register is used to exit the process if the swing voltages have not settled to the desired values within a specified number of iterations. This or a similar calibration process may be repeated periodically to accommodate changes due to e.g. temperature and supply voltage. Such embodiments need not use the timeout register, but may instead e.g. perform single-step trim adjustments from time to time.

Recalling that the swing voltages are to be centered on the switching threshold voltage of an inverter, control circuitry 155 measures threshold voltage Vt using the measurement technique of FIG. 4 (step 507). In this example, the controller is preset to establish a desired swing voltage of 600 mV centered about voltage Vt. Assuming voltage Vt is 400 mV, in step 509 control circuitry 155 calculates the target peak voltages Vpo and Vpc to be Vt+600 mV/2=700 mV and the target trough voltages Vto and Vtc to be Vt−600 mV/2=100 mV. The swing and threshold voltages for clock signals osc[P,N] and clk[P,N] are the same in this example, but other embodiments may establish different swing and threshold voltages for different signals.

Once the target values for the four peak and trough voltages are known, control circuitry 155 measures each in turn and adjusts them as needed to bring them closer to their desired values. Changing one value can affect one or more of the others, however, so the process iterates through cycles of measuring and adjusting the peak and trough voltages until they each converge on or near their target values.

At step 511, control circuitry 155 measures the peak voltage Vpo for clock signal osc[P,N]. Per step 513, if the measured voltage Vpo is not equal to the target for peak voltage Vpo, then control circuitry 155 moves to step 515 and adjusts voltage Vpo by updating the contents of register 305 (FIG. 3). The process then moves to step 517, decision 519, and possibly to step 521, to measure and correct the trough voltage Vto for clock signal osc[P,N]. Identical steps are performed and decisions made for voltages Vpc and Vtc associated with clock signal clk[P,N] so that each of the two peak and two trough voltages is measured and corrected as needed.

Having worked through each of the four trim settings, control circuitry 155 determines whether they are correct within the resolution of the measurement (decision 535), or within some acceptable tolerance level. If so, the process is finished (step 537), though the process may be repeated from time to time to adjust for e.g. supply-voltage and temperature changes that may affect the swing voltages. If, in decision 535, control circuitry 155 determines that one or more voltages are incorrect, then the process moves to decision 539 to determine whether the adaptation process has timed out. If so, the process finishes despite the imperfect swing settings. If the process has not timed out, however, the timeout value Timeout is decremented (step 541) and the process returns to step 511. The process thus iterates until the peak and trough voltages converge on or near their target values. In some embodiments the update steps (e.g. 515) move incrementally to close on their target values instead of making rather more abrupt adjustments.

Figure 6:
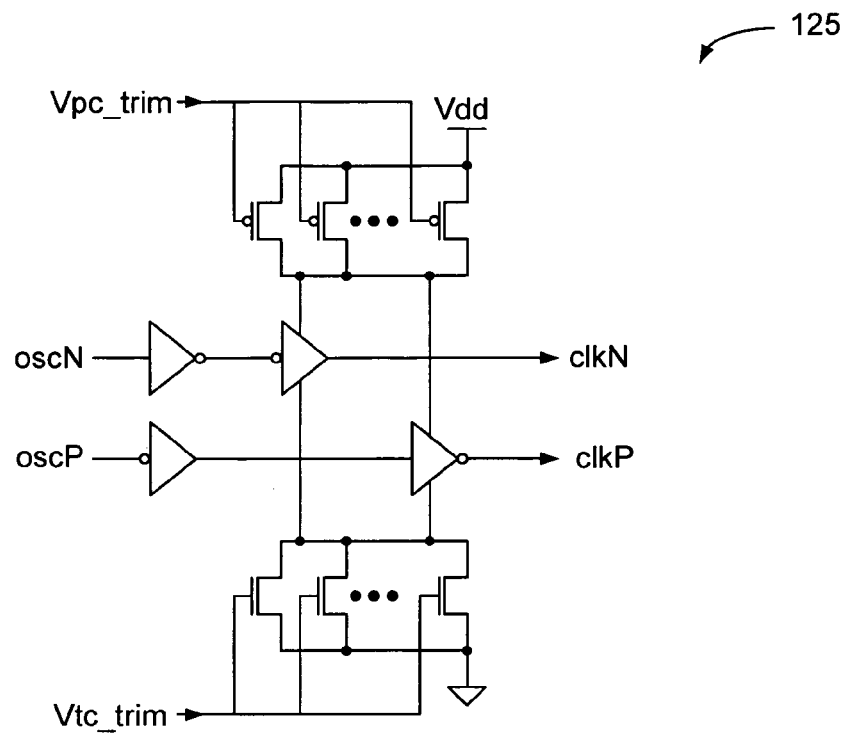
FIG. 6 depicts clock source buffer 125 of FIG. 1 in accordance with one embodiment.

FIG. 6 depicts clock source buffer 125 of FIG. 1 in accordance with one embodiment. Each bit of signal Vpc_trim, e.g. an eight-bit binary number, selectively enables one of a collection of pMOS pull-up transistors to alter the resistance between a pair of inverters and supply node Vdd, and consequently alters the peak voltages of signals clkN and clkP. Each bit of signal Vtc_trim likewise selectively enables one of a collection of nMOS pull-down transistors to alter the trough voltages of signals clkN and clkP. Clock signal clk[P,N] may be inverted with respect to signal osc[P,N] in other embodiments.

Figure 7:
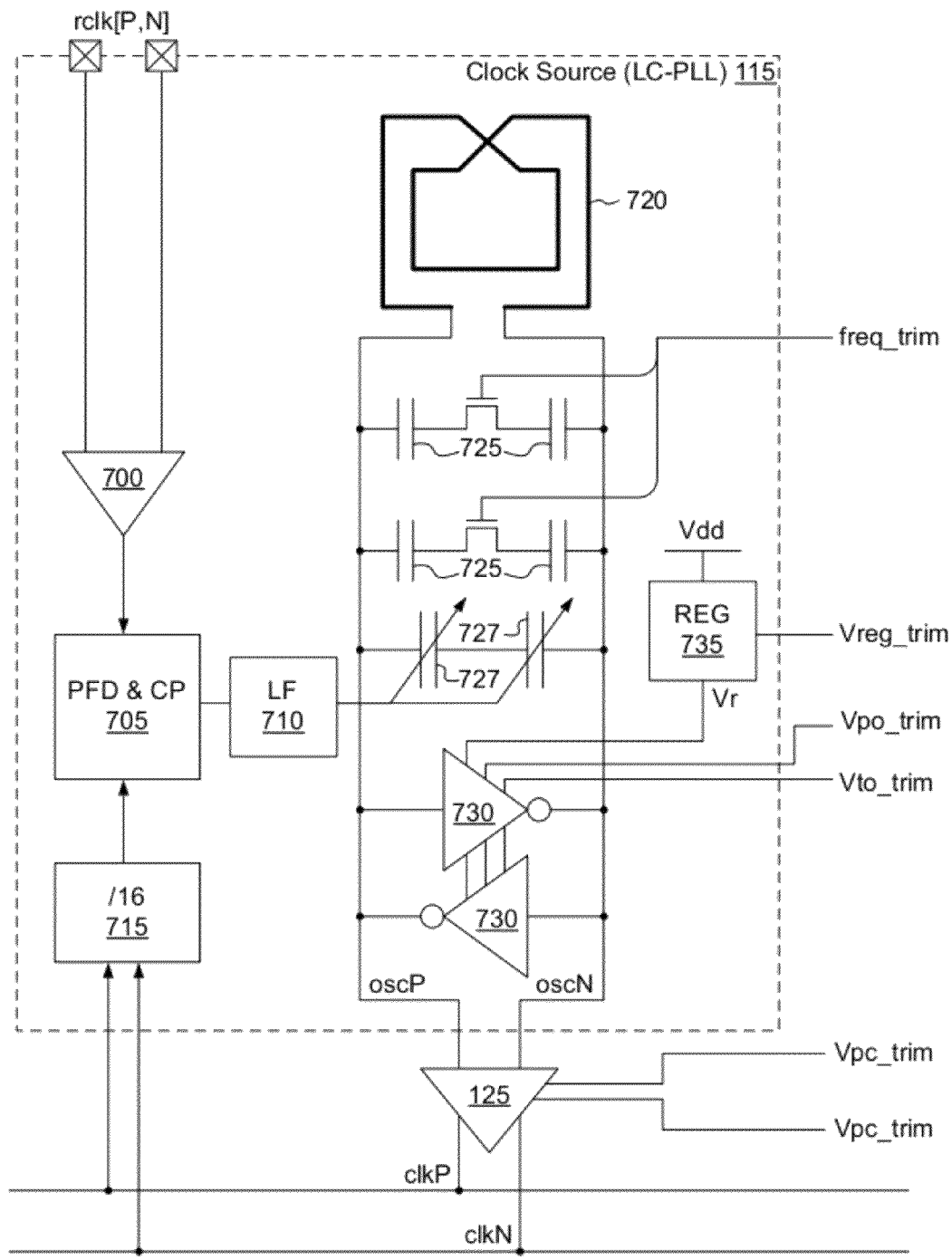
FIG. 7 depicts an embodiment of clock source 115 of FIG. 1 implemented using a CMOS LC phase-lock loop (LC-PLL).

FIG. 7 depicts an embodiment of clock source 115 of FIG. 1 implemented using a CMOS LC phase-lock loop (LC-PLL). Clock source 115 conventionally includes a reference-clock buffer 700, a phase-frequency detector with charge pump 705, a loop filter 710, and a clock divider 715. Clock source 115 additionally includes a tank inductor 720, which may be e.g. a flat differential spiral coil on the top two levels of metal.

The frequency of clock source 115 may be grossly tuned using a frequency-trim signal to switch in a number of fixed tuning capacitances 725, which are finger-type metal-metal capacitors in one embodiment. A tuning voltage from loop filter 710 drives accumulation-mode 1-V (thin-oxide) varactors 727 for fine frequency tuning, though other embodiments can be tuned using different methods and circuits. The tuning range is about ±10%, in one embodiment, to cover process variations in the tuning elements. Losses in the tank are restored by a pair of cross-coupled CMOS inverters 730 (inverting clock buffers) whose positive supply voltage is supplied from an on-chip regulator 735. The regulator output voltage Vr is set digitally by a control processor, possibly integrated with swing control circuitry 155, nominally to about 0.85×Vdd. The swing and common-mode output voltage from clock source 115 are set in the manner detailed above to provide optimal drive to source buffer 125. In this example, clock source 115 multiplies reference clock signal rclk[P,N], e.g. from an off-chip source, to half the bit rate of transceivers 110 (FIG. 1).

Figure 8:
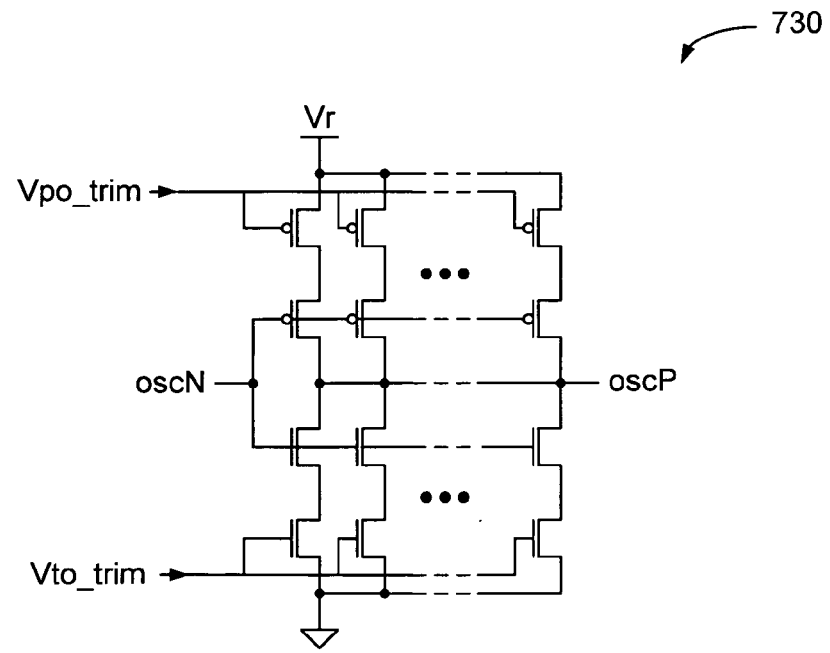
FIG. 8 depicts one of inverters 730 of FIG. 7 in accordance with one embodiment.

FIG. 8 depicts one of inverters 730 of FIG. 7 in accordance with one embodiment. Each bit of signal Vpo_trim, e.g. an eight-bit binary number, selectively enables one of a collection of pMOS pull-up transistors to alter the supply impedance for a corresponding CMOS inverter, and consequently alters the peak voltage of signal oscP. Each bit of signal Vto_trim likewise selectively enables one of a collection of nMOS pull-down transistors to alter the trough voltage of signal oscP. An identical inverter, cross-coupled with the inverter of detailed here, provides the same adjustments for signal oscN.

In the foregoing description and in the accompanying drawings, specific terminology and drawing symbols are set forth to provide a thorough understanding of the foregoing embodiments. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be a single-conductor signal line, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

The present invention is not limited to the foregoing embodiments. For example, other types of oscillators (e.g. a ring-oscillator-based VCO) could be used; inductors could be implemented using e.g. wirebonds, and could be located elsewhere on the clock distribution network; different types and numbers of clock destinations (e.g. transmitters and/or receivers) can be serviced by the clock distribution network; and the transmitters and/or receivers can be arranged in a 2-D array instead of a linear array. Furthermore, the circuits and methods detailed above are not limited to clock signals. For example, circuits that measure swing voltage using rectifier 140 can be used more generally for any differential signal with sufficient swing and edge density to overcome leakage on the rectifier outputs.

Still other embodiments will be evident to those of skill in the art. Moreover, some components are shown directly connected to one another while others are shown connected via intermediate components. In each instance the method of interconnection, or "coupling,"establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C.§112.

What is claimed is:

1. An integrated circuit comprising:
a source clock buffer to convey a buffered clock signal exhibiting a first voltage swing, the source clock buffer including a control port to receive a voltage-swing adjustment signal;
a clock distribution network connected to the source clock buffer, the clock distribution network to convey the buffered clock signal exhibiting the first voltage swing;
a plurality of clock destination circuits coupled to the source clock buffer via the clock distribution network;
a first control loop coupled between the clock distribution network and the control port, the first control loop to adjust the voltage-swing adjustment signal responsive to the first voltage swing; and
a clock source to deliver a source clock signal of a second voltage swing to the source clock buffer and a second control loop coupled to the clock source to adjust the second voltage swing.

2. The integrated circuit of claim 1, wherein the clock distribution network is a resonant network.

3. The integrated circuit of claim 2, wherein the clock distribution network includes an inductor.

4. The integrated circuit of claim 1, wherein the clock source comprises a voltage-controlled oscillator.

5. The integrated circuit of claim 1, wherein the clock source includes an inductor.

6. The integrated circuit of claim 1, the first control loop including a rectifier coupled to the clock distribution network to produce a voltage measure of the first voltage swing.

7. The integrated circuit of claim 6, wherein the first control loop issues the voltage-swing adjustment signal responsive to the voltage measure of the first voltage swing.

8. The integrated circuit of claim 1, wherein the first control loop includes a voltmeter.

9. An integrated circuit comprising:
a clock source to provide a first clock signal;
a source clock buffer having a source-buffer input port, coupled to the clock source to receive the first clock signal, a source-buffer output port to convey a buffered clock signal exhibiting a voltage swing, and a source-buffer control port to receive a voltage-swing adjustment signal;
a clock distribution network connected to the source-buffer output port, the clock distribution network to convey the buffered clock signal exhibiting the voltage swing;
a plurality of clock destination circuits each having a destination-circuit input port coupled to the source-buffer output port via the clock distribution network; and
a control loop coupled between the clock distribution network and the source-buffer control port, the control loop including a voltage reference to provide a reference inverter switching threshold voltage to the control loop;
wherein the control loop adjusts the buffered clock signal responsive to the reference inverter switching threshold.

10. The integrated circuit of claim 9, wherein the control loop adjusts the buffered clock signal to center the buffered clock signal around the switching threshold.

11. The integrated circuit of claim 10, wherein the buffered clock signal is a differential signal.

12. An integrated circuit comprising:
a buffer having a buffer input port to receive an input signal, a buffer output port to convey a buffered signal, and a buffer control port, wherein the buffered signal exhibits a voltage swing and the buffer control port is to receive a voltage-swing adjustment signal;
a rectifier coupled to the buffer output port to produce a measure of the voltage swing of the buffered signal; and
a control loop coupled between the rectifier and the buffer control port.

13. The integrated circuit of claim 12, wherein the rectifier is coupled to the buffer to produce a voltage measure of the buffered signal, and wherein the control loop controls the buffer responsive to the voltage measure.

14. The integrated circuit of claim 12, wherein the buffer inverts the input signal to produce the buffered signal.

15. The integrated circuit of claim 14, further comprising a second buffer cross-coupled with the first-mentioned buffer.

16. The integrated circuit of claim 12, wherein the buffered signal is a clock signal, the integrated circuit further comprising a clock distribution network connected to the buffer output port, the clock distribution network to convey the buffered signal exhibiting the voltage swing.

17. The integrated circuit of claim 16, further comprising a plurality of clock destination circuits each having a destination-circuit input port coupled to the buffer output port via the clock distribution network.

18. A method comprising:
developing a differential signal exhibiting a voltage swing between a peak voltage and a trough voltage;
measuring a buffer switching threshold voltage;
establishing a peak-voltage reference and a trough-voltage reference from the buffer switching threshold voltage;
measuring the peak voltage and the trough voltage;
comparing the measured peak and trough voltages with the respective peak-voltage reference and trough-voltage reference; and
adjusting, responsive to the comparing, at least one of the peak voltage and the trough voltage.

19. The method of claim 18, further comprising distributing the differential signal to a plurality of destination nodes.

20. The method of claim 19, wherein the differential signal is a clock signal.

21. A computer-readable medium having stored thereon a data structure defining a signal-distribution system for instantiated on an integrated circuit, the data structure comprising:
first data representing a buffer having a buffer input port to receive an input signal, and buffer output port to convey a buffered signal, and a buffer control port, wherein the buffered signal exhibits a voltage swing and the buffer control port is to receive a voltage-swing adjustment signal;
second data representing a rectifier coupled to the buffer output port to produce a measure of the voltage swing of the buffered signal; and
third data representing at least a portion of a control loop coupled between the rectifier and the buffer control port.

22. An integrated circuit comprising:
a clock source node to provide a first clock signal;
a source clock buffer having a source-buffer input port, coupled to the clock source node to receive the first clock signal, a source-buffer output port to convey a buffered clock signal exhibiting a voltage swing, and a source-buffer control port to receive a voltage-swing adjustment signal;

means for measuring a peak-voltage and a trough-voltage of the buffered clock signal; and means for adjusting, adjusting, responsive to the measuring, at least one of the peak voltage and the trough voltage.

23. The integrated circuit of claim 22, further comprising means for means for measuring a buffer switching threshold voltage, and for selecting target peak and trough voltages based on the buffer switching threshold voltage.

24. An integrated circuit comprising:
a clock buffer to output a buffered clock signal exhibiting a voltage swing;
a clock distribution network to distribute the buffered clock signal to a plurality of clock destination circuits;
a comparison circuit to compare the voltage swing of the buffered clock signal against a threshold; and
a control circuit coupled between the comparison circuit and the clock buffer, the control circuit to adjust the voltage swing of the buffered clock signal based on an output of the comparison circuit.

25. The integrated circuit of claim 24, further comprising a clock pad to receive an external reference clock signal, wherein the buffered clock signal is derived from the external reference clock signal.

26. The integrated circuit of claim 25, further comprising a clock source disposed between the clock pad and an input to the clock buffer to convey the external reference clock signal to the clock buffer.

27. The integrated circuit of claim 26, the control circuit coupled to the clock source to adjust the external reference clock signal to the clock buffer.

28. The integrated circuit of claim 24, wherein the clock distribution network is a resonant network.

29. The integrated circuit of claim 28, wherein the clock distribution network comprises an integrated inductor.

30. The integrated circuit of claim 24, wherein the clock buffer is a differential clock buffer.

31. The integrated circuit of claim 24, wherein the buffered clock signal exhibits a peak voltage and a trough voltage, and wherein the control circuit adjusts at least one of the peak voltage and the trough voltage.

32. The integrated circuit of claim 24, wherein the voltage swing of the buffered clock signal includes at least one of a peak voltage and a trough voltage.

33. The integrated circuit of claim 24, wherein the threshold includes an inverter switching threshold voltage.

34. An integrated circuit comprising:
a clock buffer to provide a clock signal exhibiting a voltage swing, the clock buffer including a control port to receive a voltage-swing-adjustment signal;
a clock network coupled to the clock buffer to convey the clock signal; and
a control loop coupled between the clock network and the control port, the control loop to adjust the voltage-swing adjustment signal responsive to a measure of the voltage swing; and
a clock source to convey a source clock signal having a second voltage swing to the clock buffer, the integrated circuit further comprising a second control loop coupled to the clock source to adjust the second voltage swing.

35. The integrated circuit of claim 34, the control loop including a voltmeter to produce the measure of the voltage swing.

36. The integrated circuit of claim 34, the control loop including a rectifier to rectify the clock signal, wherein the measure of the voltage swing is a measure of the rectified clock signal.

37. The integrated circuit of claim 34, further comprising a clock network to distribute the clock signal.

38. The integrated circuit of claim 37, further comprising destination circuits connected to the clock network to receive the distributed clock signal.

39. The integrated circuit of claim 34, wherein the clock network is a resonant network.

40. The integrated circuit of claim 39, wherein the clock network includes an inductor.

\* \* \* \* \*